(12) United States Patent
Dong

(10) Patent No.: US 9,530,925 B2
(45) Date of Patent: Dec. 27, 2016

(54) CONDUCTIVE COMPOSITION AND METHOD FOR MAKING CONDUCTIVE FEATURES ON THIN FILM PV CELLS

(75) Inventor: Chun Christine Dong, Macungie, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 13/877,839

(22) PCT Filed: Oct. 7, 2011

(86) PCT No.: PCT/US2011/055377
§ 371 (c)(1),
(2), (4) Date: Apr. 4, 2013

(87) PCT Pub. No.: WO2012/054245
PCT Pub. Date: Apr. 26, 2012

(65) Prior Publication Data
US 2013/0196465 A1 Aug. 1, 2013

Related U.S. Application Data

(60) Provisional application No. 61/394,480, filed on Oct. 19, 2010.

(51) Int. Cl.
*B05D 5/12* (2006.01)
*H01L 31/18* (2006.01)
*H01B 1/02* (2006.01)
*H01B 1/22* (2006.01)
*H01L 31/0224* (2006.01)

(52) U.S. Cl.
CPC ............ *H01L 31/1884* (2013.01); *H01B 1/02* (2013.01); *H01B 1/22* (2013.01); *H01L 31/022425* (2013.01); *Y02E 10/50* (2013.01)

(58) Field of Classification Search
USPC .......................................... 427/74
See application file for complete search history.

(56) References Cited

U.S. PATENT DOCUMENTS

| | | | |
|---|---|---|---|
| 5,080,815 A * | 1/1992 | Fenoglio et al. | 508/190 |
| 5,246,785 A * | 9/1993 | Matano et al. | 428/542.2 |
| 5,661,041 A * | 8/1997 | Kano | 438/72 |
| 5,853,622 A | 12/1998 | Gallagher et al. | |
| 5,882,722 A | 3/1999 | Kydd | |
| 6,036,889 A | 3/2000 | Kydd | |
| 6,143,356 A | 11/2000 | Jablonski | |
| 6,153,348 A | 11/2000 | Kydd et al. | |
| 6,156,237 A | 12/2000 | Kubota et al. | |
| 6,214,527 B1 * | 4/2001 | Kosaka et al. | 430/319 |
| 6,274,412 B1 | 8/2001 | Kydd et al. | |
| 6,379,745 B1 | 4/2002 | Kydd et al. | |
| 6,951,666 B2 | 10/2005 | Kodas et al. | |
| 2003/0124259 A1 * | 7/2003 | Kodas et al. | 427/376.6 |
| 2004/0144958 A1 | 7/2004 | Conaghan et al. | |
| 2006/0283499 A1 * | 12/2006 | Terakawa et al. | 136/258 |
| 2009/0107544 A1 | 4/2009 | Carroll et al. | |
| 2010/0084757 A1 * | 4/2010 | Hariharan et al. | 257/690 |

\* cited by examiner

*Primary Examiner* — Austin Murata
(74) *Attorney, Agent, or Firm* — Amy Carr-Trexler

(57) ABSTRACT

A method for forming a conductive feature. The method includes providing a substrate and a conductive composition. The conductive composition includes metal particles, a fluxing agent and a liquid monomer. The method further includes heating the composition to a temperature from about 200 to about 300° C. to fuse metal particles, crosslink the liquid monomer, and form a conductive feature.

18 Claims, 1 Drawing Sheet

CONDUCTIVE COMPOSITION AND METHOD FOR MAKING CONDUCTIVE FEATURES ON THIN FILM PV CELLS

FIELD

The present disclosure relates to a process for producing conductive features and composition for forming conductive features. The processes for producing conductive features are processes that can form conductive features at low temperatures.

BACKGROUND

To alleviate an energy crisis caused by insufficient energy supply due to a continually increased energy demand and to mitigate influences on the ecology of the earth associated with conventional power generation from fossil fuels or nuclear power, there is a growing consensus on the use of sunlight as an alternative energy source since the solar energy is unlimited, clean, and ubiquitous.

Photovoltaic (PV) solar cells make it possible to convert the sunlight into electricity. However, a wide use of solar power generation depends on technology advances that lead to higher efficiency, satisfied reliability, and lower cost, thus making it more competitive with the conventional power generation methods. One of the most important and costly aspects of solar cell manufacture is the way of contact metallization (also called "electrode"), which provides electrically conducting paths on the surface of cell to collect and transfer photo converted charges to an external circuit, thus generating useful electrical energy. The reliability and efficiency of solar cells are largely affected by the nature and quality of the metal contacts.

Crystal silicon solar cells constitute an important technology in production. Crystalline solar cells are fabricated using either mono-crystalline silicon or multi-crystalline silicon as substrates. These substrates are commonly modified with a dopant of either positive or negative conductivity type, and are on the order of 50-500 microns in thickness. The surface of the substrate, such as a wafer, intended to face incident light, is designated as the front surface and the surface opposite the front surface is referred to as the back surface. By convention, positively doped silicon is commonly designated as "p", where holes are the majority electrical carriers. Negatively doped silicon is designated as "n" where electrons are the majority electrical carrier. The key to the operation of a photovoltaic cell is the creation of a p-n junction, usually formed by further doping a thin layer at the front surface of the silicon substrate. Such a layer is commonly referred to as the emitter layer, while the bulk silicon is referred to as the absorber layer. The emitter may be either p-doped or n-doped depending on the configuration of the device.

Electrodes are formed on the front and back of crystalline silicon PV devices. Electrodes on the front are typically formed using metal pastes, composed primarily of silver and silver alloys. These electrodes are deposited in arrays on the front surface of the device using techniques such as screen printing. The substrate is typically the silicon solar cell covered by a dielectric film, typically silicon nitride, that serves as an antireflective coating. Electrodes on the front or back side of the device have the requirement of high conductivity and low contact resistance.

Currently, there is a global trend in the PV industry toward developing thin film solar cells. The reason is that wafer based solar cells are difficult to mass-produce and cannot be provided inexpensively, as they require much time and energy for crystal growth and complex subsequent manufacturing steps. Amorphous silicon type solar cell is expected as one of the most promising thin film solar cells, because it has excellent characteristics such as the operability with thin films due to its great light absorption coefficient and the easy formation in large area on a low-cost or flexible substrate through relatively simple manufacturing steps.

The photoelectric conversion layer in thin film solar cells contains at least one or more p-i-n junctions and the stack of the active layer is normally microns thick, while in conventional wafer based solar cells, the active layer is typically hundreds of microns thick. Therefore, the sheet resistance of the active layer in thin film solar cells is much higher than that in wafer based cells. The high sheet resistance of the active layer retards lateral charge transfer during charge collection by front electrode. While, an increase in the density of grid lines on the sun-facing front face of the solar cell will deteriorate the shading effect on the photovoltaic junction and reduce cell output. To compensate this drawback of thin film active layer, the front electrode of thin film solar cells is generally a transparent conductive oxide (TCO), such as indium tin oxide (ITO) or zinc oxide, which enables incident light to reach the light absorbing material and serves as an ohmic contact to collect electrical charges converted there from the light radiation. The TCO also acts as an anti-reflective coating (ARC) layer. Since the resistance of TCO is intrinsically high compared with those of thick film made charge collectors, TCO must be made hundreds of nanometers to microns thick in order to create an electrode layer with a sufficient conductivity. Even though, metal grid lines are still required to be added on the TCO surface to further assist in charge collecting. An intimate contact between metal in the grid lines and TCO surface is highly desired to ensure the efficiency of the charge collecting.

Several methods are known for electrode formation. Vapor deposition or sputtering to form a conductive metal can form electrodes, but suffers from the drawback that these methods are not cost effective on large-area cell devices. One method for forming electrode on thin film and silicon wafer based PV solar cells is using screen printed thick film technology.

The quality of amorphous silicon can be easily damaged when processing temperatures subsequent to the formation of the active layers is at or above 250° C. For this reason, polymer thick film (PTF) method is desirable for forming metal grid lines. PTF pastes may contain metal particles, polymer resins, and other additives. The pastes are deposited on the TCO surface by screen printing into a grid line pattern and then curing at a relatively low temperature, such as below 250° C. After curing, metal particles are physically connected each other and fixed by a polymer matrix, thus forming a conductive film. The polymer resins or binders also provide an adhesion between PTF and TCO. However, charge collecting electrodes manufactured by these known methods suffer from the drawback of a decrease in conversion efficiency and are not satisfactory in the reliability in the prolonged use as compared with those electrodes made of metal thick film method. The drawbacks for electrodes formed from these methods include the following:

1) The resistivity of such types of collecting electrodes (approximately 30 to 50 μΩ-cm) is significantly higher than that made by metal thick film on c-Si based cells (5 to 8 μΩ-cm), leading to an increase in Joule loss and this increases the loss of conversion efficiency.

2) Polymer binders do not act as barriers to oxygen. The resistivity of the electrode increases with time due to a continual oxidation on the metal particle surface, which largely reduces the electrode durability against temperature and humidity.
3) The curing time of PTF is normally long (e.g. 30 minutes to one hour or more), which largely increases the process cycle time.
4) The solderability of the formed PTF electrode is normally poor due to insufficient and embedded metal particles.
5) Some material in PTF, such as a polymer binder, can optically degrade upon irradiation with light to cause breaking of the electrode and peeling off of the electrode from TCO surface, thus making the electrode to lose its function.
6) It is the surface oxidation of metal particles in the existing PTF technology that inhibits the use of most metals as conductive fillers. Only noble metals, such as silver, are widely used as a conductive filler material in PTF, which not only increases the material cost but also brings a silver migration problem.

Generally speaking, copper is more desirable than silver as a printed conductor due to its low material cost and favorable electrical properties, such as higher electro migration resistance and lower self diffusivity. However, copper differs from silver because it normally has a relatively thick and non conductive native oxide layer on the surface and it has a high oxidation potential, which are significant technical challenges associated with switching silver by copper for most of printed electronics applications. Therefore, the use of copper thick film for front-side contacts on thin film PV solar cells is not generally known.

Following efforts have been made by previous researchers to solve the oxidation induced degradation of electrical performance. Dielectric encapsulates have been applied to adhesives to form an oxidation barrier, but this only retards rather than prevents oxidation. Oxide-reducing agents have been added to adhesives and this approach is only effective over a short period of time. Acid anhydride epoxy hardener has also been used. The epoxy can initially reduce surface oxides, but continual aging causes the oxide to reform. Using a metal alloy powder with a low melting point as a binder to bond Ag particles into a network structure in the conductive adhesive has been pursued. However during soldering, the formed network structure can be destroyed and metal alloys have an intrinsically, low electrical conductivity.

As described above, typical PTF conducting materials are made of individual particles which are physically connected each other. In contrast, PARMOD® materials provide "chemical welding" of pure metals including copper, thus forming electrical conductors made of a continues network structure. These materials are disclosed in, for example, in U.S. Pat. No. 5,882,722, U.S. Pat. No. 6,036,889, U.S. Pat. No. 6,143,356, U.S. Pat. No. 6,153,348, U.S. Pat. No. 6,274,412 B1, U.S. Pat. No. 6,379,745 B1, which are hereby incorporated by reference in their entirety. In addition, PARMOD® materials can be consolidated at relatively low temperatures (e.g., 220° C.) in a forming gas environment (e.g., 5% $H_2$ in $N_2$) with an electrical resistivity better than that of Ag PTF (e.g., 21 μΩ-cm for PARMOD® copper versus 30 to 50 μΩ-cm for Ag PTF).

The PARMOD® compositions generally contain a Reactive Organic Medium (ROM) and metal flakes and/or metal powders, which are blended together with liquid organic vehicles, to produce printable inks or pastes or toners. The ROM consists of either a Metallo-Organic Decomposition (MOD) compound or an organic reagent, which can form such a MOD compound upon heating in the presence of the metal constituents. During heating, individual metal atoms can be generated thermally upon decomposition of the MOD compound, which thus "chemically welds" the flakes and/or powder constituents of the mixture together into a network structure. A carboxylic acid, such as neodecanoic acid, is used in PARMOD® copper composition as a fluxing agent to remove oxides from copper particle surface. This oxide removal forms copper neodecanoate, which acts as a copper MOD compound and generates fresh copper atoms for particle fusion during thermal consolidation.

However, the capability of removing oxides on copper particle surface at low temperatures (e.g. 200° C. or below) by using the PARMOD® compositions is limited, such that a dense particle packing and an efficient particle fusion may be hindered during the consolidation process. As a result, the electrical conductivity and mechanical strength of the sintered copper conductor may not be satisfied. It is desirable to have little or no residual non-conductive species from the oxide removal process. In addition, the oxide removal should be depressed at room temperature to maintain chemical stability and shelf life of the conductive composition. Furthermore, it is desirable to reduce the temperature for copper conversion from copper MOD, thus copper conductor can be formed at low temperatures.

PARMOD® copper conductive material does not adhere well on commonly used substrates, such as polymers, papers, and TCO surfaces. Achieving sufficient adhesion without sacrificing the desired electrical resistivity in the conductive feature is very challenging. For example, carboxylic acids are also very effective crosslinking moieties when present in their reactive form in a composition containing a thermosetting resin, such as an epoxy. Therefore, to use a thermosetting resin in the conductive composition for achieving an adhesion to a substrate, a chemical protection of the carboxylic acid has been applied to ensure chemical stability and prevent premature polymerization. The protection can be achieved by binding the functional group of the carboxylic acid with a chemically or thermally triggered species, so that it becomes reactive only above certain temperatures. However, this approach will reduce the oxide removal capability of the acid and the oxide removal is very critical for particle fusion of non-precious metals, such as copper.

An effort was made by adding a separate adhesive layer to the substrate surface for adequate adhesion of PARMOD® materials to rigid printed circuits. However, because the adhesive layer can infiltrate into the porous metal trace during thermal consolidation, this approach degrades the electrical performance of the PARMOD® compositions. Suitable adhesive coatings are not widely available on substrates of commercial interest, such as paper and polymer based substrates. In addition, coated substrates are generally more expensive than uncoated substrates.

Although attempts, such as US 2004/0144958 A1, which is hereby incorporated by reference in its entirety, have been made to improve adhesion of the PARMOD®conductive materials, a suitable solution to this problem has still not been developed, especially for copper. For example, there was no any result demonstrating electrical performance and adhesion for the polymer-containing PARMOD® copper compositions. In addition, the thermal consolidation temperature for copper was quite high, such as 350° C.

U.S. Pat. No. 6,951,666, which is hereby incorporated by reference in its entirety, describes a screen printable metal precursor composition with a viscosity above 1000 centipoises for fabricating a conductive feature on a substrate. The composition contains a metal precursor compound, a liquid vehicle, metallic particles, and other additives, such as a polymer. During heating, the metal precursor compound will convert to metal thermally or thermal-chemically. However, the U.S. Pat. No. 6,951,666 patent doesn't teach forming non-precious metal conductors, such as copper conductors, having good adherence and low resistivity. Examples of copper compositions given in the U.S. Pat. No. 6,951,666 patent have poor electrical performance. For example as introduced in the U.S. Pat. No. 6,951,666 patent the resistivity of the formed copper after a thermal consolidation at 350° C. is 24 times of bulk copper (example 30).

Accordingly, there is a need in the art to provide compositions comprising metals, particularly non-precious metals such as copper, and methods comprising same, that provide sufficient adhesion of conductive feature on substrates, especially on thermally sensitive substrates such as on TCO surface, and that have improved electrical conductivity and mechanical strength of the formed metal features. In addition, it is desirable that the compositions have chemical stability and extended shelf life.

BRIEF SUMMARY

An aspect of the present disclosure includes a method for forming a conductive feature. The method includes providing a substrate and a conductive composition. The conductive composition includes metal particles, a fluxing agent and a liquid monomer. The method further includes heating the composition to a temperature from about 200 to about 300° C. to fuse metal particles, crosslink the liquid monomer, and form a conductive feature.

Another aspect of the present disclosure includes a conductive composition. The conductive composition includes metal particles, a fluxing agent, and a liquid monomer. The fluxing agent can be thermally activated to effectively remove oxides from the surface of the metal particles.

Other features and advantages of the present invention will be apparent from the following more detailed description of the preferred embodiment, taken in conjunction with the accompanying drawings which illustrate, by way of example, the principles of the invention.

DETAILED DESCRIPTION

The articles "a" and "an" as used herein mean one or more when applied to any feature in embodiments of the present invention described in the specification and claims. The use of "a" and "an" does not limit the meaning to a single feature unless such a limit is specifically stated. The article "the" preceding singular or plural nouns or noun phrases denotes a particular specified feature or particular specified features and may have a singular or plural connotation depending upon the context in which it is used. The adjective "any" means one, some, or all indiscriminately of whatever quantity. The phrase "at least a portion" means "a portion or all." As used herein, "plurality" means at least two. The term "conductive" and grammatical variations thereof, as used herein, means having the property of at least some electrical conductivity.

The present disclosure includes adding a liquid monomer in conductive compositions to provide sufficient adhesion of conductive feature on substrates, especially on thermally sensitive substrates such as on TCO surface, and that maintain the highly conductive nature of the formed metal features. During heating the monomers can be self-crosslinked at a desired temperature range such that metal particle fusion is not impeded and a continual metal network structure can be formed. During storage, the chemical stability and shelf life of the conductive composition is preserved.

Figure 1:
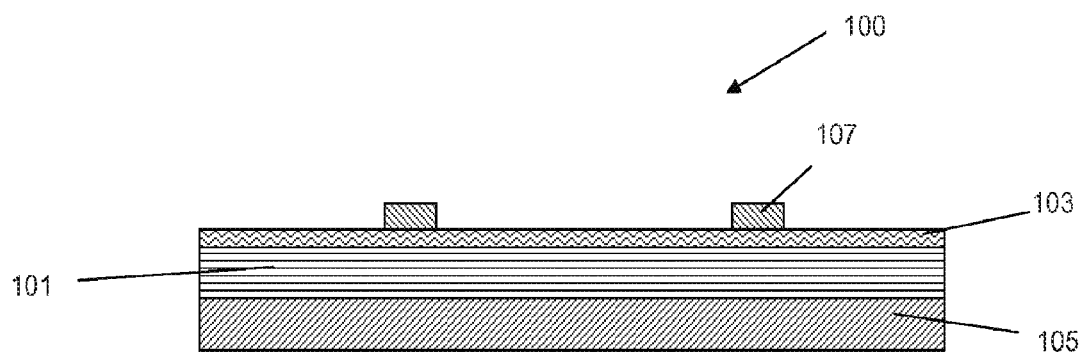
FIG. 1 is a sectional view of an exemplary thin film solar cell.

FIG. 1 shows an example of an amorphous silicon-based thin film solar cell device 100, in which a light absorbing layer 101 made of an amorphous silicon and a TCO layer 103 are deposited on an electrically conductive substrate 105. In addition, a charge collecting electrode 107 made of metal grid lines is formed on the TCO surface. When light shines on the photoelectric conversion layer from the side of the collecting electrode, light energy is converted into electric current and taken away from the collecting electrode and the electrically conductive substrate as the outputs.

Figure 2:
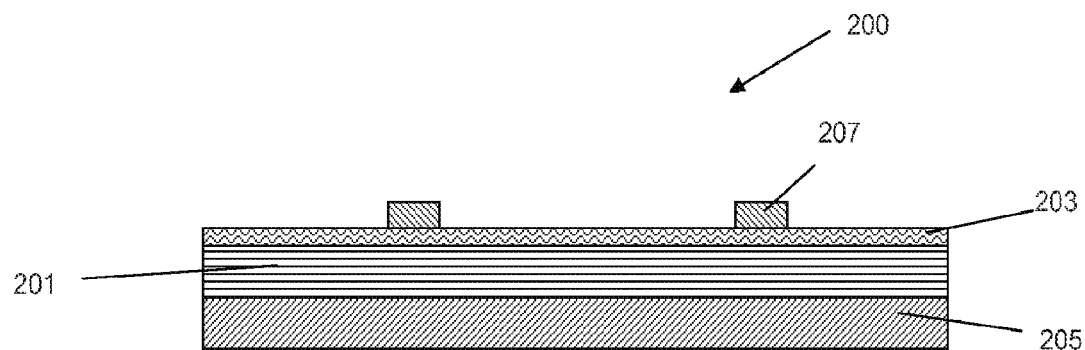
FIG. 2 is a sectional view of an exemplary crystalline silicon solar cell.

FIG. 2 shows an example of an crystalline silicon-based solar cell device 200, in which a light absorbing layer 201 made of p-n junction of crystalline silicon and an antireflective layer 203 are deposited on an electrically conductive substrate 205. In addition, a charge collecting electrode 207 made of metal grid lines is formed on the antireflective layer surface. When light shines on the photoelectric conversion layer from the side of the collecting electrode 207, light energy is converted into electric current and taken away from the collecting electrode and the electrically conductive substrate as the outputs.

Suitable substrates for depositing the conductive features include, but are not limited to, solar cell structures, such as thin film cells or crystalline solar cells. The substrate may include, for example, a thin film or a mono-crystalline or multi-crystalline silicon cell and corresponding coatings and structures. In one embodiment, the substrate is a thin film solar cell having a TCO film on the surface thereon. In another embodiment, the substrate is a crystalline solar cell having a film stack comprising an antireflective coating, and a crystalline silicon p-n junction based solar cell. In one embodiment, the antireflective coating may include a dielectric film. The dielectric film may be any suitable dielectric material such as, but not limited to silicon nitride. In other embodiments, the substrate includes a crystalline silicon solar cell and includes a patterned surface. Conductive features may be formed on the patterned surface by providing the conductive composition, such as by direct screen printing, onto the patterned surface. In certain embodiments, the patterning and/or barrier deposition on the solar cell may be coupled with application of the conductive composition. The patterned surface may be formed, for example, by removal of portions of the dielectric film. In another embodiment, a conductive composition is applied to the antireflective coating and is fired so as to etch through the antireflective coating to make ohmic contact with an underlying silicon emitter layer. In another embodiment, the patterned surface is formed by selective removal of portions of a dielectric film and deposition of a barrier layer in the removed positions. In still another embodiment, the antireflective coating is a conductive film having good surface passivation, and the conductive composition can be directly applied thereon.

Disclosed herein are conductive adhesive compositions comprising metals particularly non-precious metals that can be applied for making conductive features on a TCO surface for various applications, especially for making electrodes on thin film photovoltaic (PV) solar cells. The invented conductive adhesive can also be applied on other substrates for other applications. The compositions comprise metal particles, a fluxing agent, monomers, and optionally other additives. During heating the monomers can be self-crosslinked at a desired temperature range such that metal particle fusion is not interfered and a continual metal network structure can be formed.

The metal powder includes metal particles having a metallic phase. Suitable metals particles may include, for example copper (Cu), silver (Ag), nickel (Ni), gold (Au), palladium (Pd), indium (In), tin (Sn), other conductive metal powders and combinations thereof. In one embodiment of the disclosure, the metal particles making up the metal compact have a combination of small and large particle sizes, for example a mixture of nanometer and micrometer-sized particles. The micron-sized particles have an average particle diameter of at least about 0.1 µm. The nanometer-sized particles have an average particle diameter not greater than 100 nm. A preferred range of micron-sized particles is about 1 to 10 µm and the size selection depends on the printed dimensions (width and thickness) of the conductive feature. A preferred range of nanometer-sized particles in certain embodiments of this invention is about 40 to 60 nm due to the following reasons. For nanometer-sized particles with an average size below 40 nanometers, a liquid dispersion is normally needed to form a colloidal state of copper particles to prevent particle aggregation. The particle loading in the colloidal solution may be limited and may include, for example, particles loadings of up to about 17 wt %. In one embodiment the conductive composition includes a combination of metal powder of about 1 micron and 60 nanometers.

The conductive composition also includes a liquid monomer. In certain embodiments, such as conductive compositions for screen printing, it may be desirable to use a self-crosslinkable monomer that has a melting temperature below ambient temperature, so that the monomer is in liquid phase during formulation process and thus more metal powders can be included in the composition without reaching the viscosity limit (e.g. too thick). The volume ratio of the monomer and metal particles is preferably to be 0.1 to 0.8, and more preferably 0.2 to 0.5. Suitable self-crosslinkable monomers include compounds with carbon-carbon double bond(s) or vinyl group(s). Examples of suitable monomers include mono and multi-functional acrylates or acrylic monomers, such as trimethylolpropane trimethacrylate, trimethylolpropane triacrylate, di(trimethylolpropane) tetraacrylate, glycerol propoxylate triacrylate, pentaerythritol tetraacrylate, and trimethylolpropane propoxylate triacrylate. A factor for achieving sufficient adhesion without sacrificing the desired electrical resistivity of a conductive composition is to control the polymerization time to be after particle fusion completed. Therefore, the liquid monomer may include a suitable crosslinking temperature to provide crosslinking that provides polymerization time that is after the particle fusion is complete.

In addition to the metal particles and liquid monomer, the conductive composition includes a fluxing agent. More specifically, the fluxing agent is a solution or a mixture of a copper carboxylate in a carboxylic acid with a different ligand. During heating, a ligand exchange reaction will result in a formation of a different copper carboxylate and a more volatile and stronger carboxylic acid (e.g., having a pKa of below 3.8). The in situ formed acid vapor can promote oxide removal on metal particle surface and also act as a catalyst to promote copper conversion, thus assisting particle fusion at low temperatures. At or below room temperature, the ligand exchange reaction is chemically unfavorable, thus maintaining the chemical stability and shelf life of the conductive composition. For example, the shelf life of the conductive composition is greater than a formic acid containing solution. Examples of suitable fluxing agents can include a solution or a mixture of copper formate in neodecanoic acid, a solution or a mixture of copper trifluoroacetate in neodecanoic acid, and combinations therefore. In each of these solutions or mixtures, the neodecanoic acid can also be re replaced by other carboxylic acids.

The conductive composition may include additional components to provide desirable properties to the conductive composition or the conductive feature formed. For example, the conductive composition can include cross linking that can be initiated and facilitated by the presence of free-radical initiators. Examples of free radical initiators include organic peroxides, azo compounds, and a combination of the two. The presence of a trace amount of free radical initiator in the conductive adhesive composition can be used to control the rate and temperature of crosslinking during the consolidation process. The free radical initiator when employed may comprise up to about 5 wt %, preferably between about 0 wt % to 3 wt %, and more preferably about 0.3 wt % to 1 wt % of the conductive adhesive composition. The conductive composition may include other additives that provide desirable properties to the conductive features formed, such as a surfactant for adjusting surface tension, a co-solvent to promote dissolution and or conversion of metal compounds, and a liquid vehicle for adjusting rheological properties of the conductive composition to make it suitable for printing.

The conductive composition is formed by combining metal particles with the liquid monomer and fluxing agent to form a conductive composition. The selection of solvents and liquid vehicles, and particle loading provide a range of printable metal paste compositions having a viscosity of 20 to 100,000 centipoises for gravure printing, flexographic printing, screen printing, and so on. For screen printable composition, the viscosity range is 40,000 to 60,000 centipoises. To break particle aggregations, a three-roll milling process is commonly applied after mixing all the ingredients in the conductive compositions. The solvents and vehicles should have suitable vapor pressures, which should not be too high to maintain their storage and work life during printing and should not be too low as to prevent removal when their work functions are completed. The solvents and vehicles should not degrade or negatively impact the performance of the substrates to be printed, and should have low impurities, low toxicities of vapors, and possess a low tendency of leaving organic residues. In certain preferred embodiments, the conductor composition may include several solvents, vehicles, or combinations thereof wherein each constituent has a different boiling point. The gradual evaporation of liquid phase during heating can enhance particle rearrangement, volatile vapor release, and still possess the required rheology of the conductive composition for printing requirements.

To form the conductive features, the conductive composition is deposited to a substrate. As utilized herein, a "conductive feature" is a trace, contact, wire, electrode, line or other feature that has electrical conductivity. The conductive composition according to embodiments of the present disclosure may be applied to substrates using any suitable printing or application process known in the art for applying or printing thick film compositions. For example, the conductive composition may be applied to the surface by printing, such as by screen printing, the conductive composition onto selected areas of the substrate. The substrate may be any suitable material for receiving a conductive feature. One suitable substrate for use with the present disclosure is transparent conductive oxide films, such as indium tin oxide, on photovoltaic cells. Other substrates that may be used in the formation of electrical conductors include not only the conventional high temperature substrates, e.g., glass or silicon and its oxides, but also low temperature substrates such as paper and polymeric substrates. Screen and stencil printing are suitable for rigid and flexible substrates. Gravure printing, impression printing and offset printing are suitable for high production rates on flexible substrates.

The conductive composition of the present disclosure does not require protection on the fluxing agent. Therefore, the fluxing agent in the conductive adhesive composition can function at its full strength for oxide removal during the thermal consolidation process. More specifically, a self-crosslinkable monomer containing carbon-carbon double bonds is added in the conductive adhesive composition. During the thermal consolidation process, the double bonds begin to open and react with other opened double bonds to crosslink into polymer network. The carboxylic acid doesn't react with the double bonds, so that polymerization can't occur at room temperature and an acceptable lifetime of the conductive adhesive composition can be ensured. During the consolidation process of the conductive composition, the cross linking reaction can be initiated by heat alone. In other embodiments, the cross lining can be initiated and facilitated by the presence of free-radical initiators. Examples of free radical initiators include organic peroxides, azo compounds, and a combination of the two. The presence of a trace amount of free radical initiator in the conductive adhesive composition can be used to control the rate and temperature of crosslinking during the consolidation process. The free radical initiator when employed may comprise up to about 5 wt %, preferably between about 0 wt % to 3 wt %, and more preferably about 0.3 wt % to 1 wt % of the conductive adhesive composition.

After deposition, the composition described herein can be consolidated to form a mechanically cohesive and electrically conductive structure. The methods used for achieving consolidation of the deposited conductor composition can be include but not limited to a conventional heating furnace, IR, UV, laser, and microwave radiation. The conductive composition on the substrate is heated to temperatures up to about 300° C., between about 200° C. and 300° C., between about 210° C. and 275° C. or about 220° C. to about 250° C. in a reducing atmosphere. The reducing atmosphere may be, for example, hydrogen diluted with nitrogen. The conductive composition is heated at temperature for sufficient time to permit fusion of the metal particles to form a conductive feature. Suitable times for heating the conductive composition include time of up to about 10 minutes. The resulting conductive feature can have a resistivity of equal to or less than ten times or equal to or less than five times the resistivity of bulk copper.

EXAMPLES

Example 1

A solution containing 3.3 wt % copper formate in NDA was prepared at a temperature around 90° C. The solution was mixed with formic acid. After mixing, the two liquids form two layers with NDA solution on the top and formic acid on the bottom, indicating an immiscibility nature of the two liquids. This result supports that when copper formate is dissolved in NDA at a temperature range below 100° C., a formation of formic acid by chemical reaction between copper formate and NDA is insignificant. In other words, the copper formate is physically dissolved when temperature is below 100° C.

Example 2

A solution of 1.35 g copper formate in 20 ml neodecanoic acid (NDA) was made by dissolving copper formate powders in NDA at 200° C. Since the temperature was above 100° C., copper neodecanoate (Cu-NDA) would be formed by chemical reaction between copper formate and NDA and formic acid as another by-product would be mainly evaporated. Three drops of the liquid solution were put on an aluminum pan and heated in 5% $H_2$ in $N_2$ to different temperatures for curing and then cool down to room temperature. It was found that when the peak temperature of each run was ≥210° C., a copper color film could be formed with no significant residue. Below 210° C., dark blue/green residue was left. This observation indicates that the copper conversion temperature of the Cu-NDA in NDA is around 210° C.

Example 3

1.35 g copper formate and 20 ml NDA was milled at room temperature. Three drops of the liquid dispersion were put on an aluminum pan and heated in 5% $H_2$ in $N_2$ to different temperatures for curing and then cool down to room temperature. It was found that when the peak temperature of each run was ≥205° C., a copper color film could be formed. Below 205° C., dark blue/green residue was left. As described previously, during heating Cu-NDA and formic acid were formed by chemical reaction between copper formate and NDA. This result indicates that with an in situ formation of formic acid the copper conversion temperature of the Cu-NDA in NDA can be reduced from 210 to 205° C.

Example 4

Three drops of a solution of Cu-NDA in toluene (60 wt %) were put on an aluminum pan and heated in 5% $H_2$ in $N_2$ to 210° C. for curing and then cool down to room temperature. It was found that the liquid turned into dark brown residue. This observation indicates that the copper conversion from Cu-NDA in liquid toluene is not effective at 210° C. The toluene has a low boiling temperature (111° C.) that evaporates and has little or no solution effects for copper conversion during heating.

Example 5

A copper paste composition comprising micron powders, nanometer powders, and NDA was prepared. The average diameters of the two size ranges of copper powders are 1 micron and 60 nanometer, respectively. The ratios of each ingredient in the composition are 0.121 NDA, 0.181 nanometer powder, and 0.698 micron powder. The composition was milled by a three roll milling machine to break particle aggregates and provide a paste. The prepared copper paste was then printed on a silicon substrate and heated in 5% $H_2$ in $N_2$ to 220° C. with a 10 minutes holding time. The electrical resistance of the formed copper trace was measured and then transferred into electrical resistivity, which was 21.1 µΩ-cm. The thickness of the formed copper film is 15 µm. This data can be used as a benchmark for conventional PARMOD® copper manufactured in a small labscale.

Example 6

A solution containing 15 wt % Cu methoxide in NDA was prepared. The purity of the copper methoxide is 97%. The solution was mixed with micron-sized and nanometer sized copper powders. The average diameters of the two size ranges of copper powders are 1 micron and 60 nanometer, respectively. The ratios of each ingredient in the composition are 0.121 solution of copper methoxide in NDA, 0.698 micron powder, and 0.181 nanometer powder. The composition was milled by a three roll milling machine to break particle aggregates and provide a paste. Such prepared copper paste was then printed on a silicon substrate and consolidated in 5% $H_2$ in $N_2$ to 220° C. with a 10 minutes holding time. The electrical resistance of the formed copper trace was measured and then transferred into electrical resistivity, which was infinity. It is known that during thermal consolidation process, the dissolved Cu methoxide will react with NDA, forming copper neodecanoate and methanol. The boiling point of methanol is 64° C. It is logical that an increase in copper MOD compound in the formulated copper mixture would increase the amount of fresh copper generated, thus improving particle fusion and related electrical performance of the consolidated copper. However, the result demonstrates that an addition of copper methoxide in the conventional PARMOD® copper formulation actually reduces the electrical performance of the consolidated copper. This reduction in electrical performance is believed to be attributed to at least the following reasons. The dissolution of Cu methoxide in NDA consumes NDA, and the formed methanol cannot act as a flux to remove native oxides from copper powder surface. Therefore, the capability of oxide removal on copper powder surface in the paste is largely degraded. In addition, the formed methanol has a low boiling temperature (64° C.) that evaporates and provides little or no solution effects for copper conversion during heating.

Example 7

A solution containing 2.3 wt % copper formate in NDA was prepared at a temperature around 80° C. then cooled to room temperature before using it to form the following copper conductor mixture. There was no copper formate precipitation was observed indicating the solution to be supersaturated. The purity of the copper formate is 97%. The solution was mixed with micron-sized and nanometer-sized copper powders. The average diameters of the two size ranges of copper powders are 1 micron and 60 nanometer, respectively. The ratios of each ingredient in the mixture are 0.121 solution of copper formate in NDA, 0.698 micron powder, and 0.181 nanometer powder. The mixture was milled by a three roll milling machine to break particle aggregates. Such prepared copper paste was then printed on a silicon substrate and consolidated in 5% $H_2$ in $N_2$ to 220° C. with a 10 minutes holding time. The electrical resistance of the formed copper trace was measured and then transferred into electrical resistivity, which was 9.8 µΩ-cm. The thickness of the formed copper film was 10 µm, which is significantly thinner than that in example 5 (15 µm). The copper trace was much stronger and smoother than the conventional PARMOD® copper. Compared with examples 5 and 6, the improved electrical resistivity and the reduced film thickness all indicate an enhanced particle densification. Although not wanting to be held to any particular theory, it is believed that during thermal consolidation process, the copper formate will react with NDA to form Cu-NDA and formic acid. The in situ formed formic acid can promote oxide removal on particle surface and copper conversion, thus resulting to a higher degree of particle fusion.

Example 8

A solution containing 15 wt % copper trifluoroacetate hydrate in NDA was prepared at room temperature. The solution was mixed with micron-sized and nanometer-sized copper powders. The average diameters of the two size ranges of copper powders are 1 micron and 60 nanometer, respectively. The ratios of each ingredient in the mixture are 0.121 solution of copper trifloroacetate hydrate in NDA, 0.698 micron powder, and 0.181 nanometer powder. The mixture was milled by a three roll milling machine to break particle aggregates. Such prepared paste was then printed on a silicon substrate and consolidated in 5% $H_2$ in $N_2$ to 220° C. with a 10 minutes holding time. The electrical resistance of the formed copper trace was measured and then transferred into electrical resistivity, which was around 6.7 µΩ-cm. The thickness of the formed copper film was 7 µm, which is even thinner than that in example 7 (10 µm). The improved electrical resistivity and the reduced film thickness all further indicate an enhanced particle densification. This result supports that an in situ formation of trifloroacetic acid during the thermal consolidation process plays an important role for assisting particle fusion and copper conversion.

Example 9

A solution containing 2.3 wt % copper formate in NDA was prepared the same way as that in example 7. The solution was combined with a liquid monomer named glycerol propoxylate triacrylate (GPT) and then mixed with micron-sized and nanometer sized copper powders. The average diameters of the two size ranges of copper powders are 1 micron and 60 nanometer, respectively. The ratios of each ingredient in the mixture are 0.698 micron powder, 0.181 nanometer powder, 0.091 solution of copper formate in NDA, and 0.030 GPT. The mixture was milled by a three roll milling machine to break particle aggregates. Such prepared copper paste was then printed on an indium tin oxide (ITO) coated glass substrate and consolidated in 5% $H_2$ in $N_2$ to 220° C. with a 10 minutes holding time. The electrical resistance of the formed copper trace was measured and then transferred into electrical resistivity, which was 14 µΩ-cm. Scotch tape was applied to the trace and immediately removed by pulling at a 90 degree angle to determine the adhesion strength of the formed copper trace on ITO surface. There was no copper trace removed by the tape, indicating a strong adhesion. The formed copper trace was solderable, but the solder wettability was rather poor.

Example 10

The same composition as in example 9 was printed on an indium tin oxide (ITO) coated glass substrate and consolidated in 5% $H_2$ in $N_2$ to 250° C. with a 10 minutes holding time. The electrical resistance of the formed copper trace was measured and then transferred into electrical resistivity, which was 8.2 µΩ-cm. Scotch tape was applied to the trace and immediately removed by pulling at a 90 degree angle to determine the adhesion strength of the formed copper trace on ITO surface. There was no copper trace removed by the tape, indicating a strong adhesion. The formed copper trace was solderable, but the solder wettability was rather poor.

Example 11

A solution containing 2.3 wt % copper formate in NDA was prepared the same way as that in example 7. The solution was combined with a liquid monomer named trimethylolpropane propoxylate triacrylate (TPT) and then mixed with micron-sized and nanometer-sized copper powders. The average diameters of the two size ranges of copper powders are 1 micron and 60 nanometer, respectively. The ratios of each ingredient in the mixture are 0.698 micron powder, 0.181 nanometer powder, 0.091 solution of copper formate in NDA, and 0.030 TPT. The mixture was milled by a three roll milling machine to break particle aggregates. Such prepared copper paste was then printed on an indium tin oxide (ITO) coated glass substrate and consolidated in 5% $H_2$ in $N_2$ to 250° C. with a 10 minutes holding time. The electrical resistance of the formed copper trace was measured and then transferred into electrical resistivity, which was 31.5 $\mu\Omega$-cm. Scotch tape was applied to the trace and immediately removed by pulling at a 90 degree angle to determine the adhesion strength of the formed copper trace on ITO surface. There was no copper trace was removed by the tape, indicating a strong adhesion. The formed copper trace was solderable and the solder wettability was fairly good.

Example 12

The same composition as in example 11 was printed on an indium tin oxide (ITO) coated glass substrate and consolidated in 5% $H_2$ in $N_2$ to 260° C. with a 10 minutes holding time. The electrical resistance of the formed copper trace was measured and then transferred into electrical resistivity, which was 17.4 $\mu\Omega$-cm. Scotch tape was applied to the trace and immediately removed by pulling at a 90 degree angle to determine the adhesion strength of the formed copper trace on ITO surface. There was no copper trace was removed by the tape, indicating a strong adhesion. The formed copper trace was solderable and the solder wettability was fairly good.

Example 13

The same composition as in example 11 was printed on an indium tin oxide (ITO) coated glass substrate and consolidated in 5% $H_2$ in $N_2$ to 270° C. with a 10 minutes holding time. The electrical resistance of the formed copper trace was measured and then transferred into electrical resistivity, which was 6.1 $\mu\Omega$-cm. Scotch tape was applied to the trace and immediately removed by pulling at a 90 degree angle to determine the adhesion strength of the formed copper trace on ITO surface. There was no copper trace was removed by the tape, indicating a strong adhesion. The formed copper trace was solderable and the solder wettability was fairly good.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

I claim:

1. A method of forming a conductive feature on a substrate comprising:
   providing a substrate;
   providing a conductive composition comprising metal particles, a fluxing agent comprised of a mixture of a copper carboxylate and a first carboxylic acid, and a liquid monomer;
   applying the conductive composition onto the substrate; and
   heating the conductive composition on the substrate in a reducing atmosphere to a temperature that is no less than 200 degrees C. and no greater than 300 degrees C. for a sufficient period of time to permit fusion of the metal particles to form the conductive feature on the substrate and to permit a substantial portion of the copper carboxylate and the first carboxylic acid to chemically react, thereby forming a second carboxylic acid that is a stronger acid than the first carboxylic acid.

2. The method of claim 1, wherein the metal particles comprise a copper powder and the heating step comprises heating the conductive composition on the substrate in a reducing atmosphere to a temperature that is no less than 200 degrees C. and no greater than 300 degrees C. for sufficient time to permit fusion of the metal particles to form a conductive feature on the substrate, the conductive feature having a resistivity of no more than ten times that of bulk copper after the heating step.

3. The method of claim 1, wherein the substrate is a thin film photovoltaic cell having a transparent conductive oxide layer disposed thereon.

4. The method of claim 1, wherein the conductive composition on the substrate is heated to a temperature of from about 210 to about 275° C.

5. The method of claim 1, wherein the in-situ formed stronger carboxylic acid has a pKa of less than 3.8.

6. The method of claim 1, wherein the reducing atmosphere comprises hydrogen diluted with nitrogen.

7. The method of claim 1, wherein the first carboxylic acid is neodecanoic acid and the second carboxylic acid is formic acid.

8. The method of claim 1, wherein the heating step heating the conductive composition on the substrate in a reducing atmosphere to a temperature that is no less than 200 degrees C. and no greater than 300 degrees C. for about 10 minutes.

9. The method of claim 1, wherein the conductive composition further comprises up to about 5 wt % free radical initiator.

10. The method of claim 1, wherein the metal particles include a combination of nanometer and micrometer-sized particles.

11. The method of claim 1, wherein the liquid monomer is a self crosslinking monomer.

12. The method of claim 1, wherein the liquid monomer is selected from the group consisting of trimethylolpropane trimethacrylate, trimethylolpropane triacrylate, di(trimethylolpropane) tetraacrylate, glycerol propoxylate triacrylate, pentaerythritol tetraacrylate, trimethylolpropane propoxylate triacrylate and combinations thereof.

13. The method of claim 1, wherein the conductive feature is an electrode for the thin film photovoltaic cell.

14. The method of claim 1, wherein the conductive feature is an electrode for a crystalline silicon photovoltaic film.

15. The method of claim 1, wherein the substrate is a film stack comprising an antireflective coating, and a crystalline silicon p-n junction-based solar cell.

16. The method of claim 1, wherein the substrate comprises a crystalline silicon solar cell and includes a patterned surface, and the applying the conductive composition includes direct screen printing of the conductive composition onto the patterned surface.

17. The method of claim 16, wherein the patterned surface is formed by selective removal of portion of a dielectric film and deposition of a barrier layer in the removed positions.

18. The method of claim 1, wherein the heating is to a temperature from about 220 to about 250° C.

* * * * *